(12) United States Patent
Zhu et al.

(10) Patent No.: US 11,322,706 B2
(45) Date of Patent: May 3, 2022

(54) QUANTUM DOT FILM, QUANTUM DOT LIGHT-EMITTING ASSEMBLY AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Wei Zhu, Beijing (CN); Zhe Li, Beijing (CN); Xiaoji Li, Beijing (CN); Haoxiang Fan, Beijing (CN); Lan Xin, Beijing (CN); Peng Li, Beijing (CN)

(73) Assignees: CHONGQING BOE OPTOELECTRONICS TECHNOLOGY CO., LTD., Chongqing (CN); BOE TECHNOLOGY GROUP CO., LTD, Beijing (CN)

( * ) Notice: Subject to any disclaimer, the term of this patent is extended or adjusted under 35 U.S.C. 154(b) by 175 days.

(21) Appl. No.: 16/396,032

(22) Filed: Apr. 26, 2019

(65) Prior Publication Data
US 2020/0075876 A1  Mar. 5, 2020

(30) Foreign Application Priority Data

Aug. 31, 2018  (CN) .......................... 201811012584.9

(51) Int. Cl.
*H01L 51/50* (2006.01)
*G02F 1/1335* (2006.01)
(Continued)

(52) U.S. Cl.
CPC .............. *H01L 51/502* (2013.01); *F21V 9/32* (2018.02); *F21V 9/38* (2018.02); *G02F 1/0063* (2013.01);
(Continued)

(58) Field of Classification Search
CPC ..................... G02F 1/133514; G02F 1/136222
See application file for complete search history.

(56) References Cited

U.S. PATENT DOCUMENTS

2017/0102588 A1\*  4/2017  Im .................... G02F 1/133528
2018/0088261 A1\*  3/2018  Song ................ G02F 1/133512
2018/0188609 A1\*  7/2018  Jun .................... G02F 1/13362

FOREIGN PATENT DOCUMENTS

CN  105895816 A  8/2016
CN  105974666 A  9/2016
(Continued)

OTHER PUBLICATIONS

The First Chinese Office Action dated Aug. 14, 2019; Appln. No. 201811012584.9.

*Primary Examiner* — Alexander P Gross (57) ABSTRACT

A quantum dot film, a quantum dot light-emitting assembly and a display device are provided. The quantum dot film includes: a quantum dot layer; and a conductive layer arranged on at least a side of the quantum dot layer along a thickness direction, and the conductive layer includes nano-sized metal particles, and at least a portion of the nano-sized metal particles are configured to generate a surface plasmon resonance under electromagnetic radiation. The luminescence efficiency and intensity of the quantum dot layer can be effectively improved by arranging the conductive layer on at least a side of the quantum dot layer.

15 Claims, 10 Drawing Sheets

(51) Int. Cl.
*G02F 1/1368* (2006.01)
*H01L 27/32* (2006.01)
*F21V 9/32* (2018.01)
*F21V 9/38* (2018.01)
*G02F 1/1362* (2006.01)
*G02F 1/13357* (2006.01)
*G02F 1/00* (2006.01)
*G02F 1/017* (2006.01)

(52) U.S. Cl.
CPC .......... *G02F 1/1336* (2013.01); *G02F 1/1368* (2013.01); *G02F 1/133514* (2013.01); *G02F 1/133602* (2013.01); *G02F 1/133617* (2013.01); *G02F 1/136222* (2021.01); *H01L 27/322* (2013.01); *G02F 1/01791* (2021.01); *G02F 1/133614* (2021.01); *G02F 2202/36* (2013.01)

(56) References Cited

FOREIGN PATENT DOCUMENTS

| | | | |
|---|---|---|---|
| CN | 106450016 | A | 2/2017 |
| CN | 108123357 | A | 6/2018 |
| CN | 108130085 | A | 6/2018 |
| CN | 108333833 | A | 7/2018 |
| CN | 109031511 | A | 12/2018 |
| KR | 100899940 | B1 | 5/2009 |

\* cited by examiner

QUANTUM DOT FILM, QUANTUM DOT LIGHT-EMITTING ASSEMBLY AND DISPLAY DEVICE

The present application claims the priority of the Chinese Patent Application No. 201811012584.9 filed on Aug. 31, 2018, which is incorporated herein by reference as a part of the present application.

TECHNICAL FIELD

The embodiment of the present disclosure relates to a field of display technology, in particular relates to a quantum dot film, a quantum dot light-emitting assembly and a display device.

BACKGROUND

With rapid development of display technology, quantum dots (QDs) have attracted attentions of researchers due to their excellent size property and luminescence property. Traditional quantum dot film sheets have defects of low excitation efficiency, low brightness and low luminescence intensity.

SUMMARY

Embodiments of the present disclosure provide a quantum dot film, a quantum dot light-emitting assembly and a display device.

At least one embodiment of the present disclosure provides a quantum dot film, and the quantum dot film comprises: a quantum dot layer; and a conductive layer, which is arranged on at least a side of the quantum dot layer along a thickness direction; the conductive layer comprises nano-sized metal particles, and at least a portion of the nano-sized metal particles are configured to generate a surface plasmon resonance under electromagnetic radiation.

For example, in a quantum dot film provided by at least one embodiment of the present disclosure, the quantum dot layer comprises quantum dots, and a distance between the quantum dot layer and the conductive layer along the thickness direction of the quantum dot layer is configured to enable a portion of the quantum dots to be located in a resonance electromagnetic field generated by the surface plasmon resonance.

For example, in a quantum dot film provided by at least one embodiment of the present disclosure, the conductive layer is located on a light-entering side of the quantum dot layer.

For example, in a quantum dot film provided by at least one embodiment of the present disclosure, the quantum dot film comprises two conductive layers, and the two conductive layers are arranged on a light-exiting side and a light-entering side of the quantum dot layer respectively.

For example, in a quantum dot film provided by at least one embodiment of the present disclosure, the quantum dot film further comprises an isolation layer, and the isolation layer is located between at least a portion of the conductive layer and at least a portion of the quantum dot layer.

For example, in a quantum dot film provided by at least one embodiment of the present disclosure, the quantum dot layer comprises quantum dot sub-layers configured to excite light of different colors; and distances between each of the quantum dot sub-layers and the conductive layer are different from each other.

For example, in a quantum dot film provided by at least one embodiment of the present disclosure, quantum dot sub-layers are located at a same layer; the conductive layer comprises conductive parts having a one-to-one correspondence with quantum dot sub-layers; and distances between each of quantum dot sub-layers and its corresponding conductive part are different from each other.

For example, in a quantum dot film provided by at least one embodiment of the present disclosure, the isolation layer comprises isolation parts; each of the isolation parts is between one of quantum dot sub-layers and the conductive layer, and thicknesses of isolation parts are different from each other.

For example, in a quantum dot film provided by at least one embodiment of the present disclosure, the isolation layer is made of a transparent insulating material.

For example, in a quantum dot film provided by at least one embodiment of the present disclosure, the isolation layer is located on all surfaces of the conductive layer and the quantum dot layer facing each other.

For example, in a quantum dot film provided by at least one embodiment of the present disclosure, the isolation layer is located on a part of surfaces of the conductive layer and the quantum dot layer facing each other.

At least one embodiment of the present disclosure further provides a quantum dot light-emitting assembly, and the quantum dot light-emitting assembly comprises a backlight source, and the quantum dot film mentioned above, in which light emitted by the backlight source illuminates the quantum dot film and makes the quantum dot film emit light.

For example, in a quantum dot light-emitting assembly provided by at least one embodiment of the present disclosure, the conductive layer is located on a side of the quantum dot layer close to the backlight source, and the light emitted by the backlight source is incident on the quantum dot layer via the conductive layer.

For example, in a quantum dot light-emitting assembly provided by at least one embodiment of the present disclosure, the quantum dot layer comprises at least two quantum dot sub-layers, and a first color light emitted by the backlight source illuminates the at least two quantum dot sub-layers; the at least two quantum dot sub-layers are located abreast on a side of the conductive layer away from the backlight source; and the at least two quantum dot sub-layers are configured to emit a second color light and a third color light respectively upon being illuminated by the first color light.

At least one embodiment of the present disclosure further provides a display device, and the display device comprises any one of the quantum dot films mentioned above.

For example, a display device provided by at least one embodiment of the present disclosure comprises a color filter layer, and the at least one quantum dot film comprises a first quantum dot film, and the first quantum dot film is used as the color filter layer and is configured to emit light upon being illuminated.

For example, in a display device provided by at least one embodiment of the present disclosure, the first quantum dot film comprises a first quantum dot layer; the first quantum dot layer comprises first quantum dot sub-layers; and a black matrix is arranged in gaps between the first quantum dot sub-layers.

For example, in a display device provided by at least one embodiment of the present disclosure, the display device comprises a backlight source, and the at least one quantum dot film comprises a second quantum dot film, the second quantum dot film is located at a light-exiting side of the backlight source and is configured to emit light upon being illuminated by light from the backlight source.

For example, in a display device provided by at least one embodiment of the present disclosure, the display device comprises a color filter layer and an electroluminescent layer, and the at least one quantum dot film comprises a first quantum dot film, a second quantum dot film and a third quantum dot film; the third quantum dot film is used as the electroluminescent layer and is configured to generate under an electric field a first color light which illuminates the first quantum dot film and the second quantum dot film; the first quantum dot film and the second quantum dot film are used as the color filter layer and are configured to emit a second color light and a third color light respectively upon being illuminated by the first color light.

For example, in a display device provided by at least one embodiment of the present disclosure, the display device comprises a quantum dot light-emitting diode, and the quantum dot light-emitting diode comprises a quantum dot light-emitting layer, and the at least one quantum dot film is used as the quantum dot light-emitting layer and is configured to emit light under an electric field.

BRIEF DESCRIPTION OF THE DRAWINGS

In order to clearly illustrate the technical solution of embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and claims of the present application, are not intended to indicate any sequence, amount or importance, but to distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to be limited to a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

Figure 1:
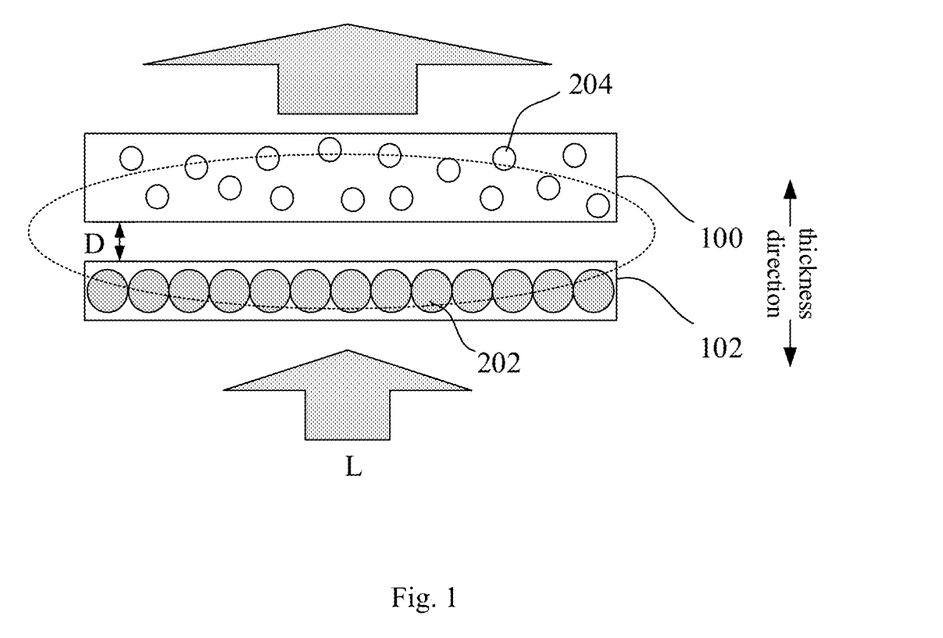
FIG. 1 is a schematic diagram of a structure of a quantum dot film according to an embodiment of the present disclosure.

As illustrated in FIG. 1, at least one embodiment of the present disclosure provides a quantum dot film, and the quantum dot film comprises a quantum dot layer 100; and a conductive layer 102 arranged on at least a side of the quantum dot layer 100 along a thickness direction, and the conductive layer 102 comprises nano-sized metal particles 202, and at least a portion of the nano-sized metal particles 202 are configured to generate a surface plasmon resonance under electromagnetic radiation.

Under electromagnetic radiation (for example photons and electrons), the nano-sized metal particles are disturbed to oscillate the charge distribution, and surface plasmon polaritons are stimulated. Surface plasmon is a wave propagating along an interface between a metal and a medium, and its amplitude decreases exponentially with a distance from the interface. In a case that a frequency of an electromagnetic wave is consistent with an oscillation frequency of surface plasmon, resonance occurs and a resonance electromagnetic field is formed. Within the fluorescent molecular radiation range, the resonance electromagnetic field can change the fluorescence attenuation rate of the surrounding medium and improve the luminescence efficiency, and thus enhance the luminescence intensity of the luminescent material. The "light-emitting" quantum dot layer mentioned in the present disclosure includes two types of quantum dot layer: a photoluminescent quantum dot layer and an electroluminescent quantum dot layer. The photoluminescent quantum dot layer is excited under an action of the photons and the electroluminescent quantum dot layer is excited under an action of the electrons. Regardless of the type of the quantum dot layer, the luminescence efficiency and intensity of the quantum dot layer can be effectively improved in embodiments of the present disclosure by arranging a conductive layer on at least a side of the quantum dot layer.

For example, as illustrated in FIG. 1, the quantum dot layer 100 comprises quantum dots 204. The distance between the quantum dot layer 100 and the conductive layer 102 is D along the thickness direction (that is, a direction perpendicular to a plane of the quantum dot layer, hereinafter referred to as "along the thickness direction") of the quantum dot layer 100. The distance D is configured to make some of quantum dots 204 within the resonance electromagnetic field generated by the surface plasmon resonance (as illustrated by a dotted frame in FIG. 1). For example, the distance D is adjustable, for example, in a range of about 5 nm to 20 nm. The distance D is not less than 5 nm. If the distance D is less than 5 nm, fluorescence resonance energy transfer is prone to occur to weaken the fluorescence emission. Because the morphology, the size and the distribution of the nano-sized metal particles affect plasmon and luminescence intensity, the distance D can be adjusted according to the shape, the size and the distribution of the nano-sized metal particles.

For example, the metal used for forming the conductive layer includes, but not limited to Au, Ag, Pd, Pt, Cu and Al, preferably Ag or Au. For Ag or Au, resonance frequency is in a visible light region, chemical property is relatively stable and conductivity is high. For example, the nano-sized particles include, but not limited to, nanorods, nanowires, nanospheres and so on. Embodiments of the present disclosure are illustrated by taking nanospheres for example, but it is understandable that other forms of nanoparticles are also within the scope of the present disclosure.

For example, as illustrated in FIG. 1, the conductive layer 102 is located on a light-entering side of the quantum dot layer 100. Incident light L enters the lower surface of the conductive layer 102 and exits from the upper surface of the quantum dot layer 100 after passing through the conductive layer 102 and the quantum dot layer 100. In a case that the incident light L illuminates the nano-sized metal particles 202 near the interface between the conductive layer 102 and the quantum dot layer 100, the nano-sized metal particles 202 are disturbed to oscillate the charge distribution, and surface plasmon polaritons are stimulated. In a case that a frequency of the incident light L is consistent with an oscillation frequency of surface plasmon, resonance occurs and a resonance electromagnetic field is formed. Within the fluorescent molecular radiation range, the resonance electromagnetic field can change the fluorescence attenuation rate of the surrounding medium and improve the luminescence efficiency of the quantum dot layer 100. In other embodiments of the present disclosure, the conductive layer 102 can be arranged on a light-exiting side of the quantum dot layer 100, which can also improve the luminescence efficiency of the quantum dot layer 100. Although the positions of the conductive layer 102 and the quantum dot layer 100 are reversed, the plasmon resonance phenomena can also occur to the nano-sized metal particles when the incident light L illuminates the nano-sized metal particles near the interface between the conductive layer 102 and the quantum dot layer 100. Therefore, the conductive layer 102 can be arranged at either the light-exiting side of the quantum dot layer 100 or the light-entering side of the quantum dot layer 100. Either way can improve the luminescence efficiency of the quantum dot layer 100 because the resonance electromagnetic field is formed near the interface between the conductive layer 102 and the quantum dot layer 100. In practical applications, metal nanomaterials with high transmittance are more suitable to be placed on a light-exiting side of a display, and can also play a role of being a barrier to external water and air.

Figure 2:
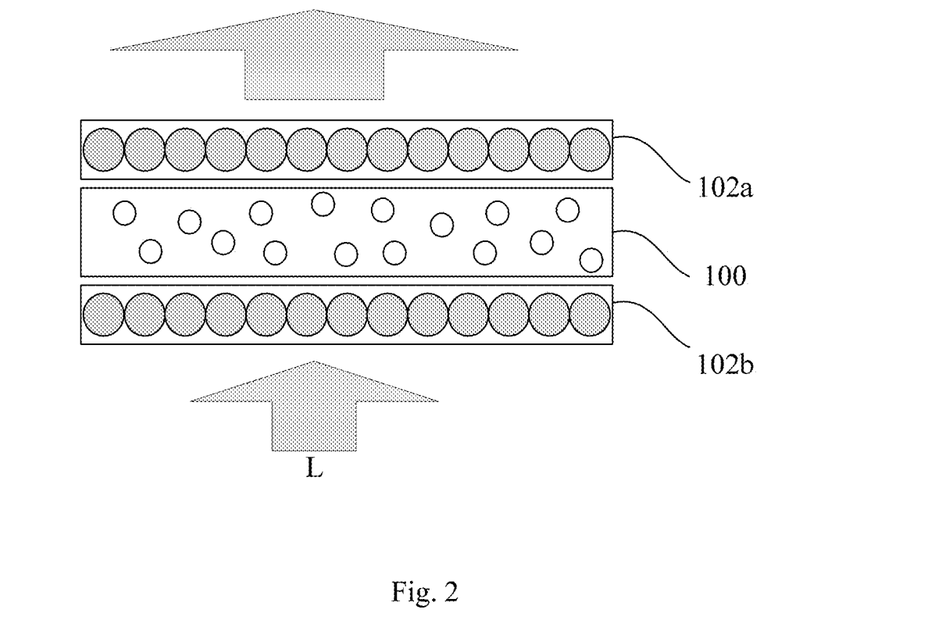
FIG. 2 is a schematic diagram of a structure of another quantum dot film according to an embodiment of the present disclosure.

In at least some embodiments of the present disclosure, as illustrated in FIG. 2, the quantum dot film comprises two conductive layers 102a and 102b, which are arranged on two opposite sides of the quantum dot layer 100 respectively, that is, the two conductive layers 102a and 102b are arranged on the light-exiting side and the light-entering side of the quantum dot layer 100 respectively. In this way, in a case that the incident light L illuminates the quantum dot layer 100, the plasmon resonance phenomenon can occur to the nano-sized metal particles near both an upper surface and a lower surface of the quantum dot layer 100, which further improves the luminescence efficiency of the quantum dot layer 100. For example, the conductive layer 102a is made of a metal nanomaterial with a high transmittance, and the conductive layer 102b is made of a same or different material as the conductive layer 102a.

Figure 3:
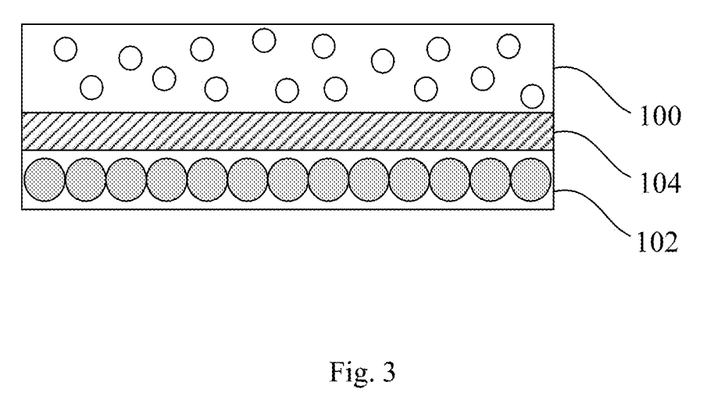
FIG. 3 is a schematic diagram of a structure of still another quantum dot film according to an embodiment of the present disclosure.

In at least some embodiments of the disclosure, as illustrated in FIG. 3, the quantum dot film further comprises an isolation layer 104, and the isolation layer 104 is located between at least a portion of the conductive layer 102 and at least a portion of the quantum dot layer 100. The distance between the quantum dot layer 100 and the conductive layer 102 along the thickness direction can be conveniently adjusted by arranging the isolation layer. For example, a thickness of the isolation layer 104 is equal to the distance between the quantum dot layer 100 and the conductive layer 102 along the thickness direction. In FIG. 3 of the embodiment of the present disclosure, all the gap between the quantum dot layer 100 and the conductive layer 102 is filled with the isolation layer 104, that is, the isolation layer 104 is located on all the surfaces of the conductive layer 102 and the quantum dot layer 100 facing each other. However, in other embodiments, a portion of the gap between the quantum dot layer 100 and the conductive layer 102 can be filled with the isolation layer 104, that is, the isolation layer 104 is located on a part of the surfaces of the conductive layer 102 and the quantum dot layer 100 facing each other. For example, in the case that the quantum dot layer comprises quantum dot sub-layers with different colors, the distances between the quantum dot sub-layers and the conductive layer may be different. The isolation layer 104 is only arranged between the quantum dot sub-layer and the conductive layer having a larger distance, and there is no isolation layer between the quantum dot sub-layer and the conductive layer having a smaller distance. Please refer to the following embodiments to obtain more details. For example, the isolation layer is made of a transparent insulating material, for example, the isolation layer is made of a transparent inorganic material, such as $SiO_2$, or the isolation layer is made of a transparent organic material, such as PET, PMMA and so on.

Figure 4:
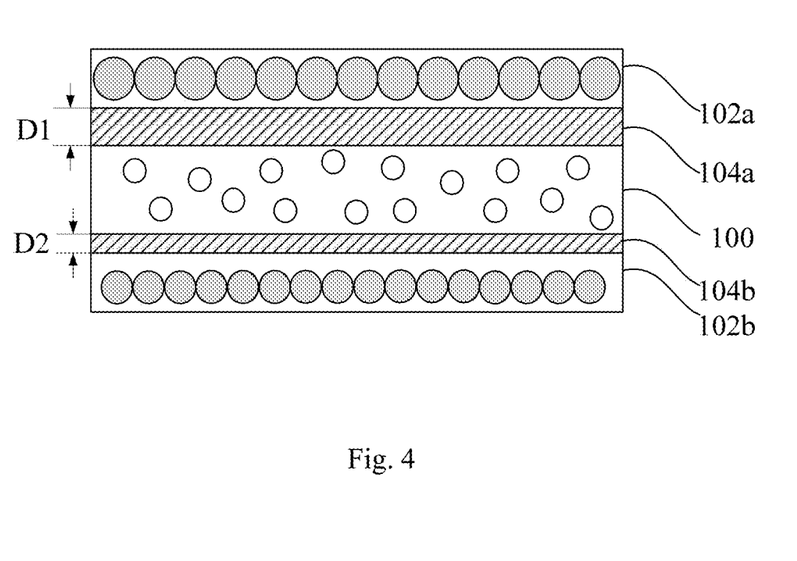
FIG. 4 is a schematic diagram of a structure of still another quantum dot film according to an embodiment of the present disclosure.

In at least some embodiments of the disclosure, as illustrated in FIG. 4, the quantum dot film comprises the quantum dot layer 100, two isolation layers 104a, 104b, and two conductive layers 102a, 102b. The two conductive layers 102a, 102b are arranged on the light-exiting side and the light-entering side of the quantum dot layer 100 respectively. The isolation layer 104a is located between the conductive layer 102a and the quantum dot layer 100, and the gap between the conductive layer 102a and the quantum dot layer 100 is filled with the isolation layer 104a. The isolation layer 104b is located between the conductive layer 102b and the quantum dot layer 100, and the gap between the conductive layer 102b and the quantum dot layer 100 is filled with the isolation layer 104b. Because the sizes of the nano-sized metal particles in the two conductive layers 102a and 102b are different from each other, the distance D1 between the conductive layer 102a and the quantum dot layer 100 along the thickness direction is different from the distance D2 between the conductive layer 102b and the quantum dot layer 100 along the thickness direction. Accordingly, the thicknesses of the two isolation layers 104a and 104b are also different from each other.

Figure 5:
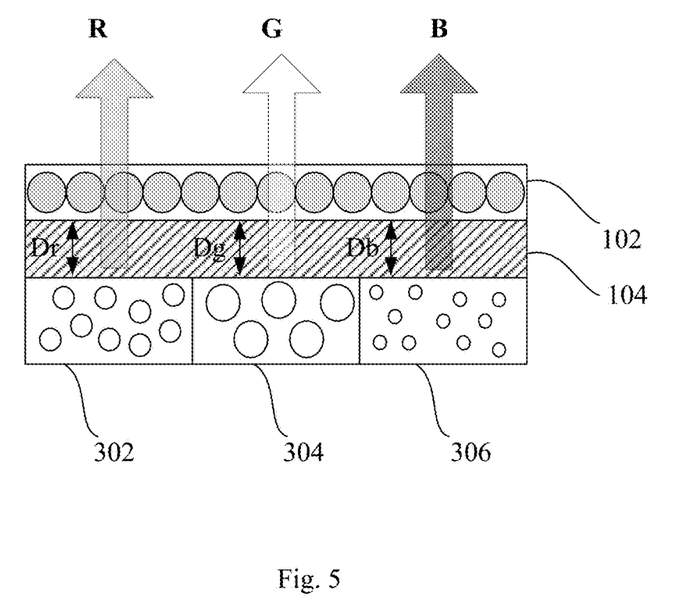
FIG. 5 is a schematic diagram of a structure of still another quantum dot film according to an embodiment of the present disclosure.

In at least some embodiments of the disclosure, as illustrated in FIG. 5, the quantum dot layer 100 comprises quantum dot sub-layers 302, 304 and 306, and quantum dot sub-layers 302, 304 and 306 emit light of different colors. The distances Dr, Dg and Db between the conductive layer 102 and each of the quantum dot sub-layers 302, 304 and 306 along the thickness direction are the same. For example, a red quantum dot sub-layer 302 comprises red quantum dots and emits red light, a green quantum dot sub-layer 304 comprises green quantum dots and emits green light, and a blue quantum dot sub-layer 306 comprises blue quantum dots and emits blue light. It is understandable that besides the red light, the green light and the blue light, the quantum dot layer can also emit other color light such as yellow light. Accordingly, the quantum dot layer can also comprise a yellow quantum dot sub-layer. For example, the quantum dot sub-layers 302, 304 and 306 are in contact with each other. For example, in a case that the quantum dot sub-layers are used as the color filter layer of a display device, gaps between the quantum dot sub-layers 302, 304 and 306 are used for forming a black matrix. In an embodiment of the present disclosure, the quantum dot film further comprises the isolation layer 104, with which the gaps between the conductive layer 102 and each of the quantum dot sub-layers are filled. In embodiments of the present disclosure, the luminescence efficiency and intensity of the quantum dot layer can be effectively improved by arranging the conductive layer on a side of each of the quantum dot sub-layers. It is understandable that, the above purpose can also be achieved by arranging the conductive layer on the light-entering side of the quantum dot sub-layers.

In practical applications, in order to meet the requirements of ideal color gamut, the requirements on luminescence intensity of quantum dot sub-layers of different colors are also different. For example, for the nano-sized metal particles with different morphologies and sizes, the distances between the conductive layer and quantum dot sub-layers of different colors are different from each other to improve the luminescence intensity of each of the quantum dot sub-layers of different colors.

Figure 6:
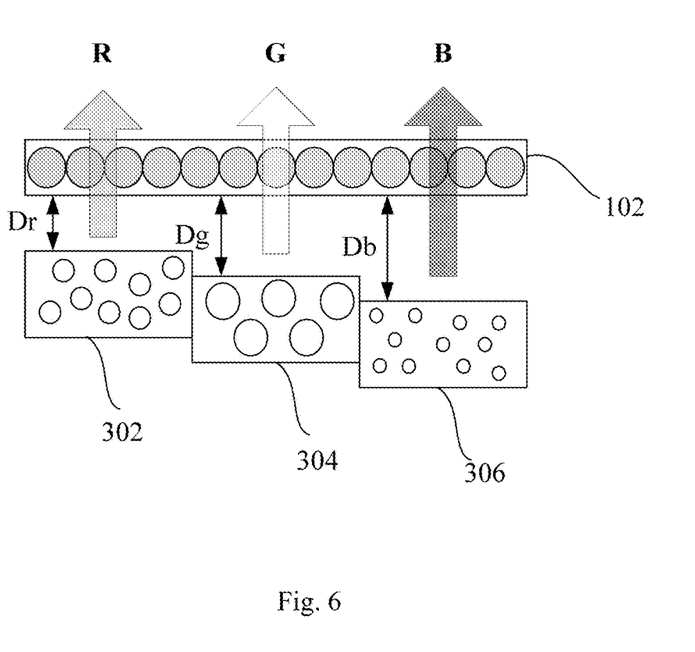
FIG. 6 is a schematic diagram of a structure of still another quantum dot film according to an embodiment of the present disclosure.

In at least some embodiments of the disclosure, as illustrated in FIG. 6, the red quantum dot sub-layer 302, the green quantum dot sub-layer 304, and the blue quantum dot sub-layer 306 have different distances Dr, Dg, Db with the same conductive layer 102. The distance Dr between the conductive layer 102 and the red quantum dot sub-layer 302, and the distance Dg between the conductive layer 102 and the green quantum dot sub-layer 304 and the distance Db between the conductive layer 102 and the blue quantum dot sub-layer 306 along the thickness direction are different from each other. In this way, the above distances can be optimized for different color quantum dot sub-layers, so as to achieve a desired luminescence intensity and a desired color gamut.

Figure 7:
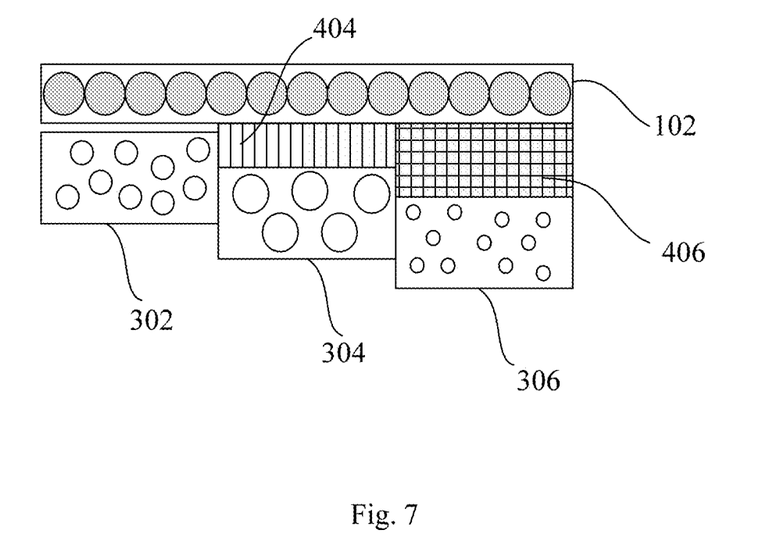
FIG. 7 is a schematic diagram of a structure of still another quantum dot film according to an embodiment of the present disclosure.

In at least some embodiments of the disclosure, as illustrated in FIG. 7, the isolation layer comprises isolation parts 404 and 406, each of the isolation parts 404 and 406 is between one of quantum dot sub-layers and the conductive layer, and the thicknesses of the isolation parts 404 and 406 are different from each other. For example, the isolation part 404 is between the green quantum dot sub-layer 304 and the conductive layer 102; the isolation part 406 is between the blue quantum dot sub-layer 306 and the conductive layer 102. The thickness of the isolation part 404 and the thickness of the isolation part 406 are different from each other. In FIG. 7, the distance between the red quantum dot sub-layer 302 and the conductive layer 102 is small, and an isolation layer may be not arranged between the red quantum dot sub-layer 302 and the conductive layer 102. It is understandable that, it is easy to adjust the distances between the conductive layer and the quantum dot sub-layers of different colors by arranging the isolation layer, and the isolation layer can also play a supporting role.

Figure 8:
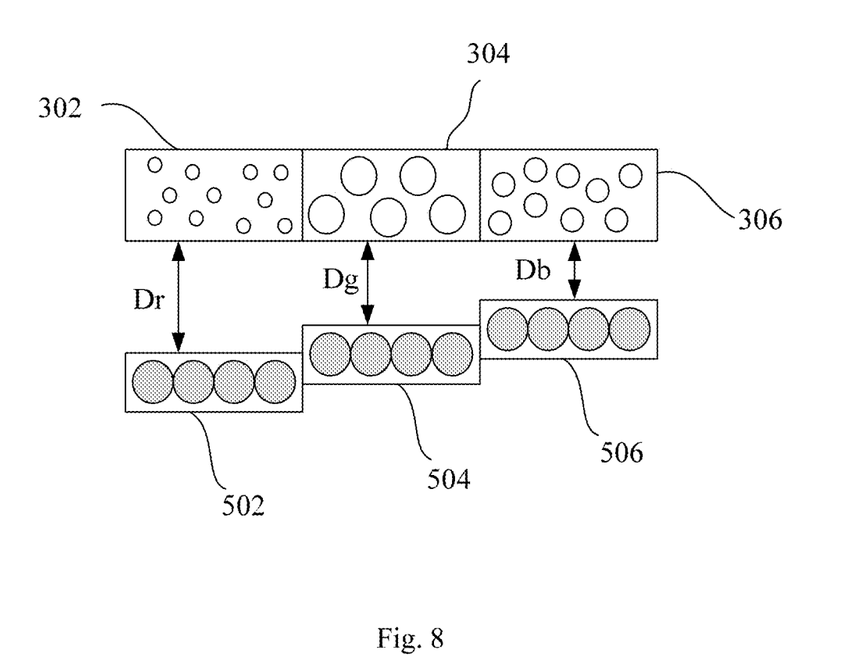
FIG. 8 is a schematic diagram of a structure of still another quantum dot film according to an embodiment of the present disclosure.

In practical applications, it is more conducive to reducing the difficulty of fabrication by arranging the quantum dot sub-layers at a same layer. In at least some embodiments of the disclosure, as illustrated in FIG. 8, the conductive layer comprises conductive parts 502, 504 and 506 having a one-to-one correspondence with quantum dot sub-layers 302, 304 and 306, and distances Dr, Dg, Db between each of quantum dot sub-layers 302, 304 and 306 and the corresponding conductive part 502, 504 and 506 are different from each other. The quantum dot sub-layers 302, 304 and 306 are arranged at a same layer, for example, all the quantum dot sub-layers 302, 304 and 306 are arranged on the isolation layer.

Figure 9:
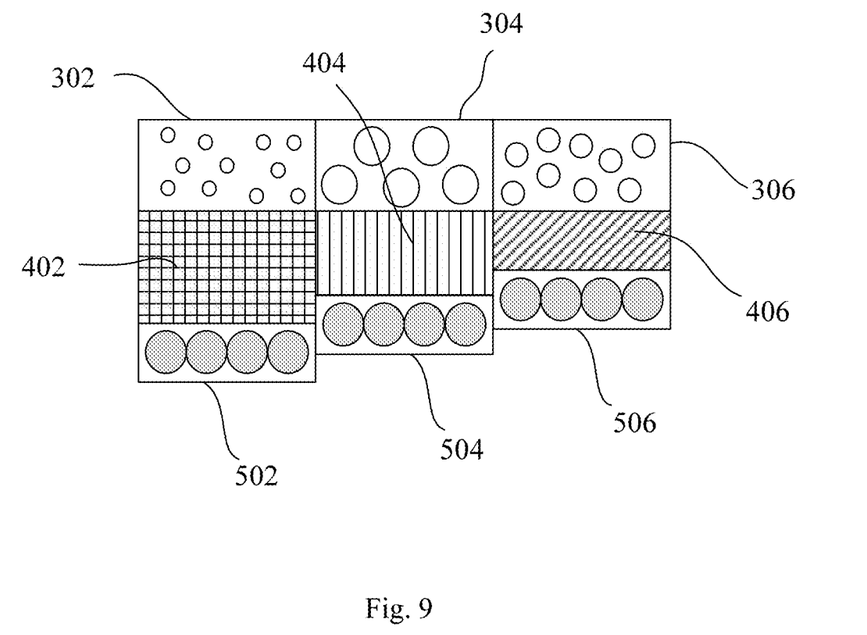
FIG. 9 is a schematic diagram of a structure of still another quantum dot film according to an embodiment of the present disclosure.

In at least some embodiments of the present disclosure, as illustrated in FIG. 9, the conductive layer comprises conductive parts 502, 504 and 506 having a one-to-one correspondence with quantum dot sub-layers 302, 304 and 306, and an isolation layer is arranged between any quantum dot sub-layer and the conductive part corresponding to the quantum dot sub-layer. For example, the isolation part 402 is located between the red quantum dot sub-layer 302 and the conductive part 502, the isolation part 404 is located between the green quantum dot sub-layer 304 and the conductive part 504, and the isolation part 406 is located between the blue quantum dot sub-layer 306 and the conductive part 506. The thicknesses of the isolation parts 402, 404 and 406 are different from each other.

Figure 10:
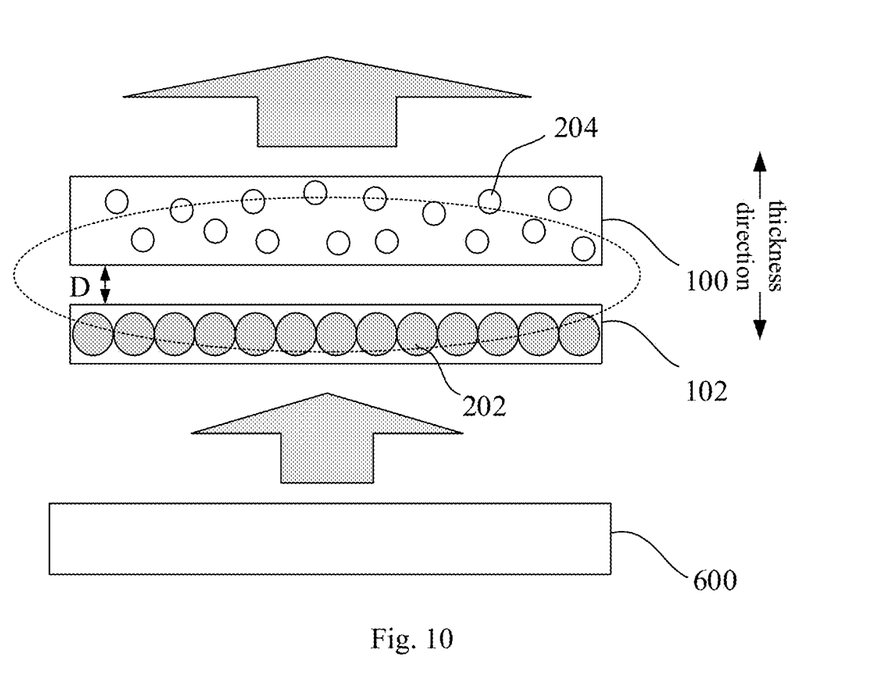
FIG. 10 is a schematic diagram of a structure of a quantum dot light-emitting assembly according to an embodiment of the present disclosure.

At least one embodiment of the present disclosure further provides a quantum dot light-emitting assembly. As illustrated in FIG. 10, the quantum dot light-emitting assembly comprises a backlight source 600 and the quantum dot film in any one of the embodiments described above, and light emitted by the backlight source 600 illuminates the quantum dot film to make the quantum dot film emit light.

For example, the quantum dot film comprises the quantum dot layer 100 and the conductive layer 102 located on at least one side of the quantum dot layer 100 along the thickness direction of the quantum dot layer 100. The conductive layer 102 comprises nano-sized metal particles 202, and at least a portion of the nano-sized metal particles 202 are configured to generate the surface plasmon resonance under an electromagnetic radiation. The luminescence intensity and efficiency of the quantum dot light-emitting assembly can be improved by arranging the conductive layer 102 on at least a side of the quantum dot layer 100.

In the embodiment of the present disclosure, the conductive layer 102 is located on a side of the quantum dot layer 100 close to the backlight source 600, and the light emitted by the backlight source 600 is incident on the quantum dot layer 100 via the conductive layer 102. The conductive layer disposed between the backlight source 600 and the quantum dot layer 100 can further prevent external light from interfering the luminescence of the quantum dot layer.

It is understandable that, the quantum dot light-emitting assembly in the embodiments of the present disclosure can use any one of the quantum dot films illustrated in FIG. 1 to FIG. 9, or various variations of the quantum dot films according to embodiments of the present disclosure described above. Without conflict, the backlight source can be combined with any one of the quantum dot films to form the quantum dot light-emitting assembly in the embodiment of the present disclosure. The quantum dot light-emitting assembly in the embodiment of the present disclosure includes the quantum dot film in any one of the embodiments described above, and therefore the same technical effects can be achieved.

Figure 11:
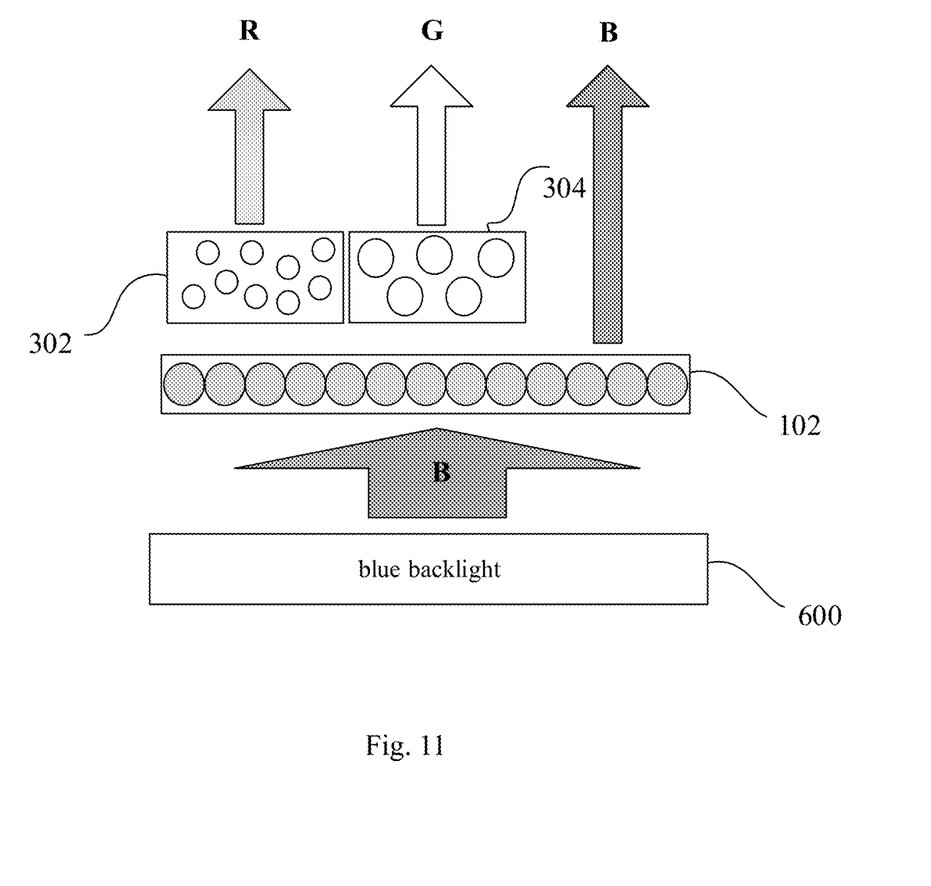
FIG. 11 is a schematic diagram of a structure of another quantum dot light-emitting assembly according to an embodiment of the present disclosure.

In at least some embodiments of the disclosure, as illustrated in FIG. 11, the quantum dot layer comprises at least two quantum dot sub-layers 302 and 304. The at least two quantum dot sub-layers 302 and 304 emit light of different colors, and are located abreast on a side of the conductive layer 102 away from the backlight source, that is the light-exiting side. The backlight source 600 can use various light sources, for example, a white LED light source, or a monochrome light source such as a blue light source. For example, the backlight source 600 is configured to emit the blue light and illuminate the red quantum dot sub-layer 302 and the green quantum dot sub-layer 304. The red quantum dot sub-layer 302 and the green quantum dot sub-layer 304 are configured to emit red light and green light respectively upon being illuminated by the blue light. The luminescence intensity and efficiency of the quantum dot light-emitting assembly can be improved by arranging the conductive layer 102 on at least one side of the quantum dot sub-layers 302 and 304.

At least one embodiment of the present disclosure further provides a display device comprising at least one quantum dot film, and the quantum dot film is the quantum dot film described in any one of the embodiments described above.

In the embodiments of the present disclosure, the quantum dot film can use the structure described in any one of the embodiments mentioned above. The luminescence intensity and efficiency of the display device can be improved by arranging the conductive layer 102 on at least one side of the quantum dot layer 100.

For example, the display device comprises a color filter layer, and the at least one quantum dot film comprises a first quantum dot film, and the first quantum dot film is used as the color filter layer and is configured to emit light upon being illuminated.

Figure 12:
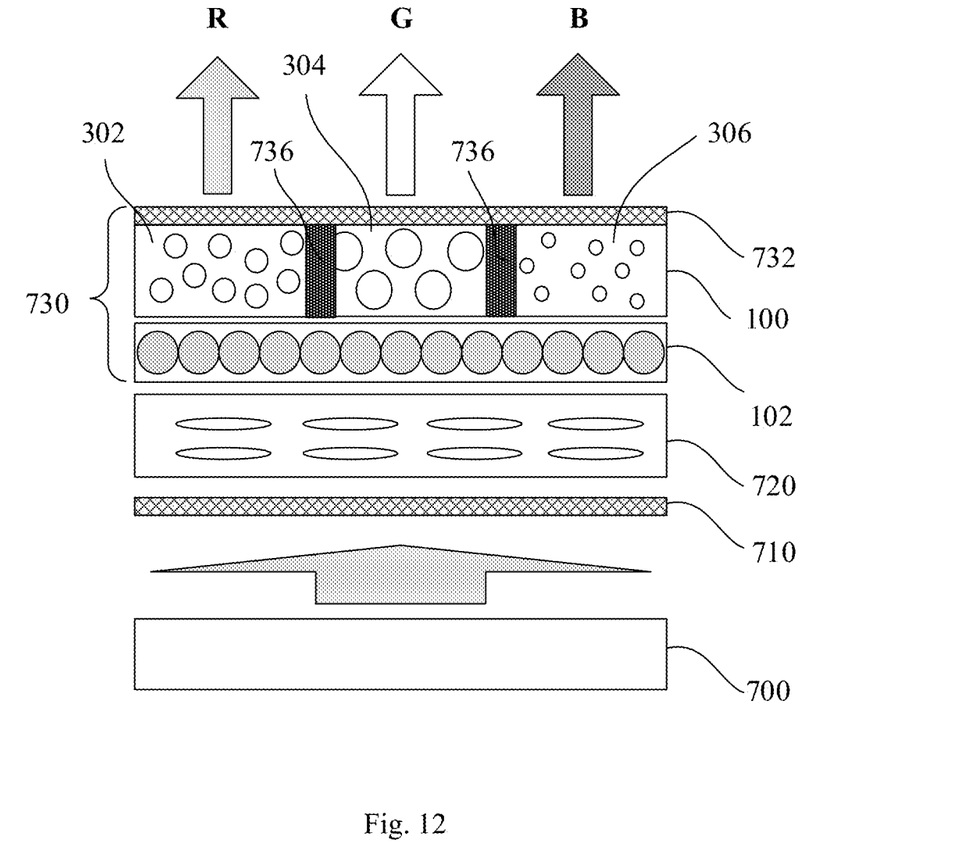
FIG. 12 is a schematic diagram of a structure of a display device according to an embodiment of the present disclosure.

In at least some embodiments of the present disclosure, as illustrated in FIG. 12, the display device is a liquid crystal display device, and the liquid crystal display device comprises a thin film transistor (TFT) substrate 710 and a color filter substrate 730 disposed opposite to each other, and a liquid crystal layer 720 is disposed between the TFT substrate 710 and the color filter substrate 730. The backlight source 700 is arranged on the light-entering side of the display device, i.e., below the TFT substrate. The color filter substrate 730 comprises: a base substrate 732, a quantum dot film located on the base substrate 732 and acting as a color filter layer, and a black matrix 736. The "TFT substrate" refers to a substrate on which a switching transistor TFT for controlling a pixel unit is arranged.

For example, the quantum dot film can adopt the structure in any one of the embodiments described above. For example, the quantum dot film comprises the quantum dot layer 100 and the conductive layer 102. The quantum dot layer 100 comprises quantum dot sub-layers configured to emit light of different colors. For example, the red quantum dot sub-layer 302, the green quantum dot sub-layer 304 and the blue quantum dot sub-layer 306 emit the red light, the green light and the blue light respectively. The black matrix 736 is located in the gap between quantum dot sub-layers to prevent light leakage. In some embodiments of the present disclosure, light emitted by the backlight source 700 passes through the TFT substrate 710 and the liquid crystal layer 720, and then enters the quantum dot film. The luminescence intensity and efficiency of the liquid crystal display device can be improved by arranging the conductive layer 102 on at least one side of each of the quantum dot sub-layers. It is understandable that the display device in the embodiment of the present disclosure also comprises conventional components of the liquid crystal display device, such as a TFT, a pixel electrode, a common electrode, a polarizer, and so on, which are omitted herein.

Figure 13:
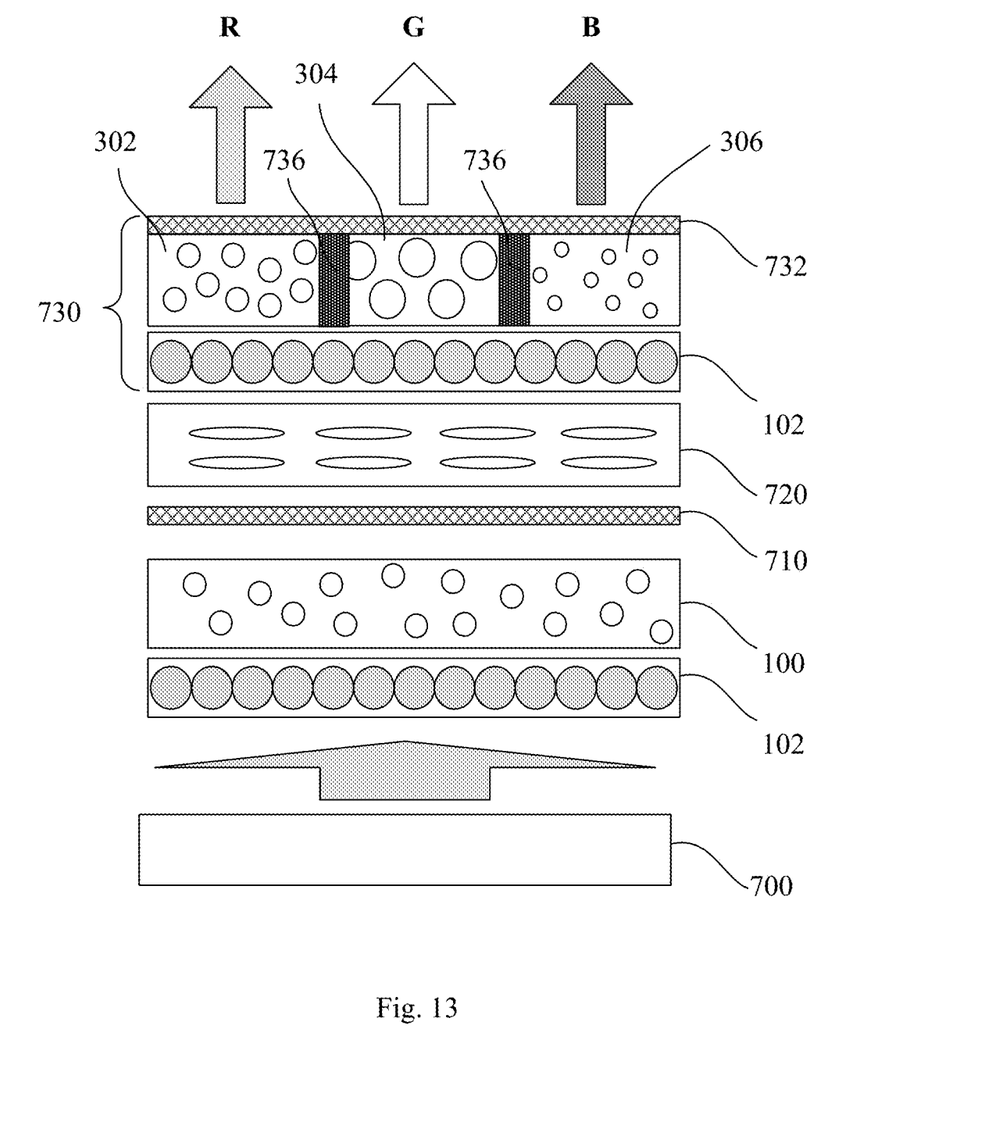
FIG. 13 is a schematic diagram of a structure of another display device according to an embodiment of the present disclosure.

In at least some embodiments of the disclosure, as illustrated in FIG. 13, the difference between the liquid crystal display device illustrated in FIG. 13 and the liquid crystal display device illustrated in FIG. 12 is that a quantum dot film is disposed between the backlight source 700 and the TFT substrate 710, and the quantum dot film can use the structure described in any one of the embodiments described above, for example, the quantum dot layer 100 and the conductive layer 102 as illustrated in FIG. 1. The quantum dot film is located on a light-exiting side of the backlight source 700 and is configured to emit light upon being illuminated by light from the backlight source 700. In this way, the luminescence intensity and efficiency of the backlight source can be further improved. Moreover, arranging the quantum dot film on the backlight side of the display device can further prevent the external light from interfering the luminescence of the quantum dot layer.

Figure 14:
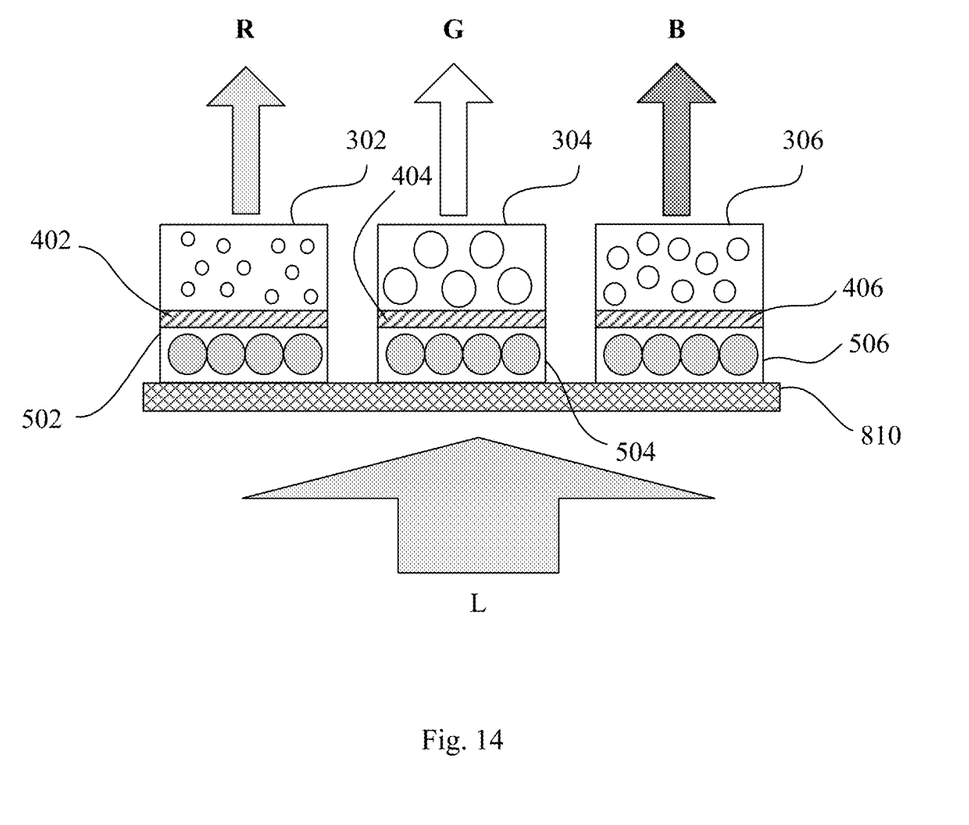
FIG. 14 is a schematic diagram of a structure of still another display device according to an embodiment of the present disclosure.

In at least some embodiments of the disclosure, as illustrated in FIG. 14, the display device comprises a COA (color on array) substrate, and the COA substrate comprises a TFT substrate 810 and a quantum dot film used as a color film layer. The quantum dot film can use any quantum dot film described in any one of the above embodiments. For example, the quantum dot film comprises a quantum dot layer 100 and a conductive layer 102, in which the quantum dot layer 100 comprises quantum dot sub-layers 302, 304 and 306, and the conductive layer 102 comprises conductive parts 502, 504 and 506 having a one-to-one correspondence with quantum dot sub-layers 302, 304 and 306 respectively. An isolation part is arranged between each of the quantum dot sub-layers and the conductive part. For example, the isolation part 402 is located between the red quantum dot sub-layer 302 and the conductive part 502, the isolation part 404 is located between the green quantum dot sub-layer 304 and the conductive part 504, and the isolation part 406 is located between the blue quantum dot sub-layer 306 and the conductive part 506. It is understandable that, the thicknesses of the isolation parts 402, 404 and 406 may be the same or different from each other. The incident light L is incident from the bottom of the COA substrate to the quantum dot film. The quantum dot film is illuminated by the incident light L and emits the red light, the green light and the blue light. The luminescence intensity and efficiency of the COA substrate and the display device can be improved by arranging the conductive layer on at least one side of the quantum dot layer.

Figure 15:
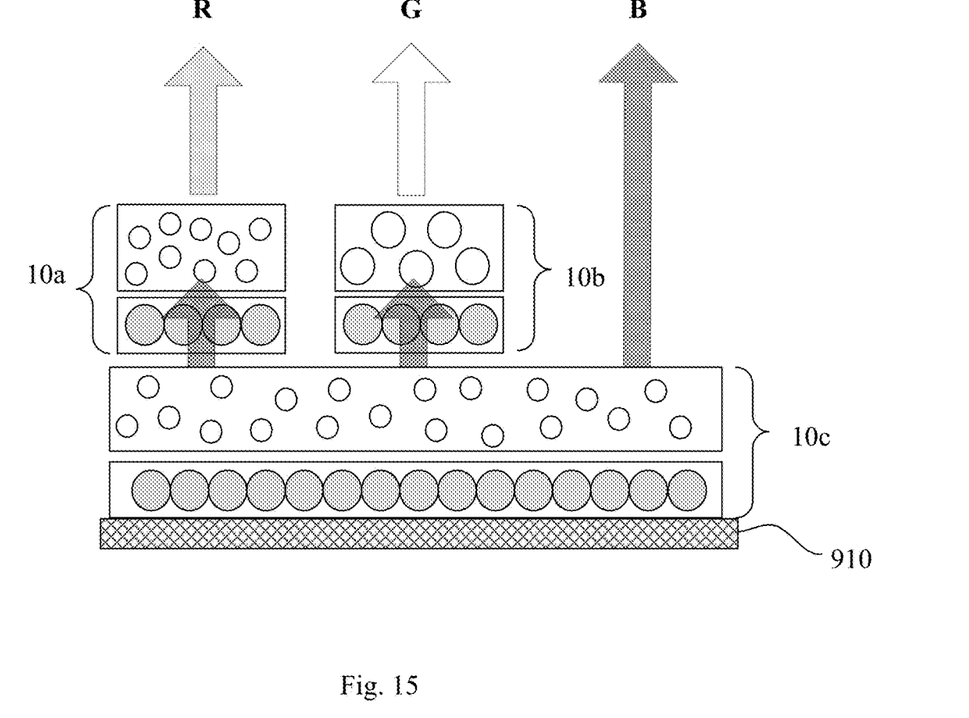
FIG. 15 is a schematic diagram of a structure of still another display device according to an embodiment of the present disclosure.

In at least some embodiments of the disclosure, as illustrated in FIG. 15, the display device comprises a quantum dot organic light-emitting diode (QD-OLED), and the quantum dot organic light-emitting diode comprises a color filter layer and an electroluminescent layer, and the display device comprises a base substrate 910, a first quantum dot film 10a, a second quantum dot film 10b and a third quantum dot film 10c arranged on the base substrate 910. The third quantum dot film 10c is used as the electroluminescent layer and is configured to generate under an electric field a first color light (for example, the blue light B) which illuminates the first quantum dot film 10a and the second quantum dot film 10b. The first quantum dot film 10a and the second quantum dot film 10b are used as the color filter layer and are configured to emit a second color light (for example, the red light R) and a third color light (for example, the green light G) respectively upon being illuminated by the first color light. In the present embodiment, the luminescence intensity and efficiency of the quantum dot organic light-emitting diode can be improved by arranging the conductive layer on at least one side of the quantum dot layer. It is understandable that, the quantum dot organic light-emitting diode in the embodiment of the present disclosure may also comprise conventional components of the quantum dot organic light-emitting diode, such as two electrodes for applying an electric field to the electroluminescent layer, which are omitted herein.

Figure 16:
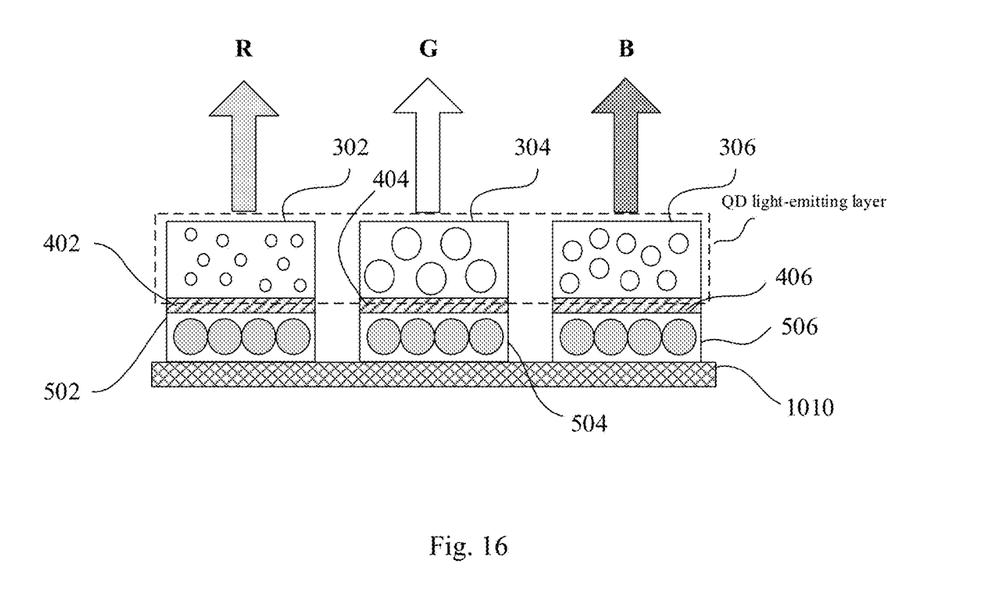
FIG. 16 is a schematic diagram of a structure of still another display device according to an embodiment of the present disclosure.

In at least some embodiments of the disclosure, as illustrated in FIG. 16, the display device comprises a quantum dot light-emitting diode, and the quantum dot light-emitting diode comprises a base substrate 1010 and a quantum dot light-emitting layer located on the base substrate 1010, and at least one of the quantum dot film is used as the quantum dot light-emitting layer and is configured to emit light under an electric field. The quantum dot film can use the structure described in any one of the above embodiments. For example, the quantum dot film comprises a quantum dot layer 100 and a conductive layer 102, in which the quantum dot layer 100 comprises quantum dot sub-layers 302, 304, 306, and the conductive layer 102 comprises conductive parts 502, 504, 506 having a one-to-one correspondence with quantum dot sub-layers 302, 304, 306 respectively. The isolation part is arranged between each of the quantum dot sub-layers and the conductive part. For example, the isolation part 402 is located between the red quantum dot sub-layer 302 and the conductive part 502, the isolation part 404 is located between the green quantum dot sub-layer 304 and the conductive part 504, and the isolation part 406 is located between the blue quantum dot sub-layer 306 and the conductive part 506. It is understandable that, the thicknesses of the isolation parts 402, 404 and 406 may be the same or different from each other. The quantum dot film can emit red light, green light and blue light directly by applying a voltage to the quantum dot light-emitting layer under an electric field. The luminescence intensity and efficiency of the quantum dot light-emitting diode can be improved by arranging the conductive layer on at least one side of the quantum dot layer.

Please note that:

(1) the drawings of the embodiments of the present disclosure are only related to the structures mentioned in the embodiments of the present disclosure, and other structures can be further obtained by general designs;

(2) for the sake of clarity, in the drawings for describing the embodiments of the present disclosure, sizes of layers or regions are not drawn according to an actual scale but are exaggerated or diminished;

(3) the embodiments of the present disclosure and the features therein can be combined with each other to obtain new embodiments in the absence of conflicts.

What are described above is related to only the illustrative embodiments of the present disclosure and not limitative to the protection scope of the present application. The protection scope of the present application shall be defined by the accompanying claims.

What is claimed is:

1. A quantum dot film, comprising:
   a quantum dot layer;
   a conductive layer, arranged on at least a side of the quantum dot layer along a thickness direction, wherein the conductive layer comprises nano-sized metal particles, and at least a portion of the nano-sized metal particles are configured to generate a surface plasmon resonance under electromagnetic radiation; and
   an isolation layer, wherein the isolation layer is located between at least a portion of the conductive layer and at least a portion of the quantum dot layer,
   wherein the quantum dot layer comprises quantum dot sub-layers configured to excite light of different colors; and distances between each of the quantum dot sub-layers and the conductive layer are different from each other; the conductive layer comprises conductive parts having a one-to-one correspondence with the quantum dot sub-layers.

2. The quantum dot film according to claim 1, wherein the quantum dot sub-layers are located at a same layer, and distances between each of the quantum dot sub-layers and its corresponding conductive part are different from each other.

3. The quantum dot film according to claim 1, wherein the isolation layer comprises isolation parts; each of the isolation parts is between one of quantum dot sub-layers and the conductive layer, and thicknesses of isolation parts are different from each other.

4. The quantum dot film according to claim 1, wherein the isolation layer is made of a transparent insulating material.

5. The quantum dot film according to claim 1, wherein the quantum dot layer comprises quantum dots, and a distance between the quantum dot layer and the conductive layer along the thickness direction of the quantum dot layer is configured to enable a portion of the quantum dots to be located in a resonance electromagnetic field generated by the surface plasmon resonance.

6. The quantum dot film according to claim 1, wherein the conductive layer is located on a light-entering side of the quantum dot layer.

7. The quantum dot film according to claim 1, wherein the isolation layer covers at least a part of surfaces of the conductive layer and the quantum dot layer facing each other.

8. The quantum dot film according to claim 7, wherein the isolation layer covers all surfaces of the conductive layer and the quantum dot layer facing each other.

9. A quantum dot light-emitting assembly, comprising:
   a backlight source, and
   the quantum dot film according to claim 1, wherein light emitted by the backlight source illuminates the quantum dot film and makes the quantum dot film emit light.

10. The quantum dot light-emitting assembly according to claim 9, wherein the conductive layer is located on a side of the quantum dot layer close to the backlight source, and the light emitted by the backlight source is incident on the quantum dot layer via the conductive layer.

11. The quantum dot light-emitting assembly according to claim 9, wherein a total number of the quantum dot sub-layers is at least two, and the quantum dot sub-layers comprise a first quantum dot sub-layer and a second quantum dot sub-layer; a light of a first color emitted by the backlight source illuminates the quantum dot sub-layers; the first quantum dot sub-layer and the second quantum dot sub-layer are located abreast on a side of the conductive layer away from the backlight source; the first quantum dot sub-layer and the second quantum dot sub-layer are configured to emit a light of a second color and a light of a third color respectively upon being illuminated by the light of the first color, and the second color, the third color and the first color are different from each other.

12. A display device, comprising the quantum dot film according to claim 1.

13. The display device according to claim 12, comprising a color filter layer, wherein the quantum dot sub-layers comprise a first quantum dot sub-layer, the conductive layer comprises a first conductive part which is on a side of the first quantum dot sub-layer along the thickness direction, and a first structure constituted by the first quantum dot sub-layer and the first conductive part is used as the color filter layer and is configured to emit light upon being illuminated.

14. The display device according to claim 13, wherein the first quantum dot film comprises a black matrix which is arranged in gaps between the quantum dot sub-layers.

15. The display device according to claim 13, comprising a backlight source, wherein the quantum dot sub-layers comprise a second quantum dot sub-layer, the conductive layer comprises a second conductive part which is on a side of the second quantum dot sub-layer along the thickness direction, and the second quantum dot sub-layer and the second conductive part constitute a second structure;

the first structure and the second structure are located on a light-exiting side of the backlight source and are configured to emit light upon being illuminated by light from the backlight source.

\* \* \* \* \*